United States Patent
Chen

(10) Patent No.: US 9,848,701 B1
(45) Date of Patent: Dec. 26, 2017

(54) INNER RAIL RELEASE DEVICE FOR A SLIDE

(71) Applicant: MARTAS PRECISION SLIDE CO., LTD., New Taipei (TW)

(72) Inventor: Wan-Lai Chen, New Taipei (TW)

(73) Assignee: Martas Precision Slide Co., Ltd., New Taipai (TW)

( * ) Notice: Subject to any disclaimer, the term of this patent is extended or adjusted under 35 U.S.C. 154(b) by 0 days.

(21) Appl. No.: 15/493,613

(22) Filed: Apr. 21, 2017

(51) Int. Cl.
*A47B 88/00* (2017.01)
*A47B 88/423* (2017.01)
*A47B 88/49* (2017.01)

(52) U.S. Cl.
CPC ............ *A47B 88/423* (2017.01); *A47B 88/49* (2017.01)

(58) Field of Classification Search
CPC ............... A47B 88/423; A47B 88/49; A47B 2088/4235; A47B 2088/4274
See application file for complete search history.

(56) References Cited

U.S. PATENT DOCUMENTS

| | | | | |
|---|---|---|---|---|
| 4,998,828 A * | 3/1991 | Hobbs | .................. | A47B 88/493 312/334.46 |
| 6,126,255 A * | 10/2000 | Yang | .................... | A47L 388/60 312/334.44 |
| 6,935,710 B2 * | 8/2005 | Chen | .................... | A47B 88/487 312/333 |
| 6,945,619 B1 * | 9/2005 | Chen | .................... | A47B 88/487 312/334.44 |
| 8,147,011 B2 * | 4/2012 | Chen | ...................... | F16C 29/04 312/333 |
| 2004/0080245 A1 * | 4/2004 | Lammens | .............. | A47B 88/49 312/333 |
| 2005/0017614 A1 * | 1/2005 | Cirocco | ................. | A47B 88/49 312/333 |
| 2006/0078235 A1 * | 4/2006 | Chen | .................... | A47B 88/493 384/18 |
| 2008/0079342 A1 * | 4/2008 | Peng | ................... | A47L 388/483 312/333 |
| 2015/0270665 A1 * | 9/2015 | Chen | .................... | A47L 388/16 439/121 |
| 2017/0159710 A1 * | 6/2017 | Chen | ....................... | F16C 43/04 |

FOREIGN PATENT DOCUMENTS

TW 350226 M 2/2009
TW 527538 I 4/2016

* cited by examiner

*Primary Examiner* — Daniel J Rohrhoff
(74) *Attorney, Agent, or Firm* — Rosenberg, Klein & Lee

(57) ABSTRACT

An inner rail release device for a slide includes a holder, a pulling rod, a first shifting block, a second shifting block, a first elastic member, a second elastic member and a driving member. The holder, the pulling rod, the first shifting block, the second shifting block, the first elastic member and the second elastic member are installed on a surface of an inner rail, and the driving member is installed on a middle rail, and the driving member is disposed opposite to the first shifting block and the second shifting block. The invention improves the convenience of operation significantly.

10 Claims, 4 Drawing Sheets

INNER RAIL RELEASE DEVICE FOR A SLIDE

FIELD OF THE INVENTION

The present invention relates to a release mechanism used in a slide, and more particularly to the release mechanism used in a three-stage slide for positioning and latching an inner rail to a position of a middle rail to achieve a quick release.

BACKGROUND OF THE INVENTION

1. Description of the Related Art

In general, an industrial computer cabinet is designed with a plurality of slides according to servers of different thicknesses, and the slides serve as a connecting mechanism between the cabinet and the servers, so that an operator or maintenance staff can pull the server out from the cabinet conveniently for the operation and maintenance of the servers. After the operation is finished, the server may be pushed back into the cabinet for storage. In general, a slide comes with a two-stage or three-stage design to extend the pulling length, and the three-stage slide is a mainstream product, and such three-stage slide is comprised of an outer rail, a middle rail in the outer rail of a sliding assembly, and an inner rail in the middle rail of the sliding assembly, wherein the inner rail is provided for combining both sides of a sever casing, and the outer rail is fixed to both sides of the cabinet. After the inner and outer rails are slidably engaged with each other through the middle rail, the inner rail is limited to slide in the extending direction of the middle rail, and the middle rail is limited to slide in the extending direction of the outer rail.

To prevent the server from being pulled out too much or falling out from the cabinet, a positioning mechanism is installed between the inner rail and the middle rail. When the inner rail is pulled out completely from the middle rail, the positioning mechanism limits the movement to prevent the inner rail from falling out, so as to prevent the server from falling out as well. As disclosed in R.O.C. Utility Model No. M350226 entitled "Slide with a latching structure", the slide comprises an outer slide and an inner slide slidable with respect to the outer slide, and the outer slide has a stepped groove formed thereon, and the inner slide has a sliding block slidable on the inner slide and latched into the stepped groove for fixing the inner slide and the outer slide, and a long pulling rod slidably installed to an inner side of the inner slide, and the long pulling rod has an inclined surface. The long pulling rod is pulled in a first direction away from the outer slide, so that the inclined surface pushes the sliding block to slide the sliding block in a second direction perpendicular to the first direction and separate the inner slide from the outer slide. Such latch structure relates to a positioning mechanism with a single bracket and two hooks, and the structure is simple, but may be damaged or deformed easily. Obviously, such conventional slide has an issue of poor durability.

As disclosed in R.O.C. Pat. No. 1527538 entitled "Slide positioning mechanism", the slide positioning mechanism is comprised of an outer rail, a middle rail disposed at the outer rail of a sliding assembly, and an inner rail disposed at the middle slide of the sliding assembly, wherein the middle rail has a positioning block; the inner rail has a positioning unit and a release linking rod; and both ends of the release linking rod have a shifting portion and a positioning notch respectively, and the release linking rod is elastically limited by at least one elastic element of the inner rail; and the positioning unit comprises a first braking block and a second braking block disposed symmetrically on the inner rail of the sliding assembly, and both of the first braking block and the second braking block are acted by at least one spring to abut against both sides of the positioning block respectively, so that the inner rail cannot slide with respect to the middle rail. When the release linking rod is moved, one of the ends of the positioning notch pushes the first braking block or the second braking block to slide, while limiting anther second braking block or first braking block to separate the braking block from the positioning block, so that the inner rail can slide with respect to the middle rail. Although such design can overcome the poor strength issue of the mechanism with a single bracket and two hooks, yet the tips of the first braking block and the second braking block rub with the positioning block during the operation, and these parts are worn frequently to produce a gap easily, and the stable positioning effect is affected adversely. Particularly, shaking or vibration may occur while the slides are being pulled.

In view of the aforementioned drawbacks, the inventor of the present invention based on years of experience in the related industry to conduct extensive research and development, and finally designed an inner rail release device for a slide, and an inclined surface with a large rubbing area is used as a driving means, and a pair of shifting blocks are used to push and latch a middle rail in order to release or latch the inner rail and the middle rail. The operation is simple, convenient and free of the wearing issue. Compared with the conventional positioning mechanisms, the present invention is more practical and useful.

2. Summary of the Invention

Therefore, it is a primary objective of the present invention to overcome the drawbacks of the prior art by providing an inner rail release device for a slide, and an inclined surface is pushed to drive a first shifting block and a second shifting block to shift in the same direction to achieve the releasing or latching effect, so as to improve the convenience of operation and provide a stable assembling.

To achieve the aforementioned and other objectives, the present invention provides an inner rail release device for a slide formed by an outer rail, a middle rail disposed inside the outer slide of a sliding assembly, and an inner rail disposed inside the middle rail of the sliding assembly, and the inner rail release device being installed on both of the middle rail and the inner rail, comprising: a holder, installed on a surface of the inner rail, and a sliding space being defined between the holder and the inner rail; a pulling rod, movably installed in the sliding space, disposed closely to the surface of the inner rail, and both ends of the pulling rod having an operating portion and an actuating portion respectively, and a first inclined surface and a second inclined surface being extended and formed when the actuating portion is moved with respect to the slide, and the first inclined surface and the second inclined surface being disposed obliquely and downwardly towards the outward direction with respect to the slide; a first shifting block, pivotally installed to the inner rail surface and configured to be corresponsive to a side of the actuating portion, and having a first oblique block protruded from the first shifting block surface, and the first oblique block leaning against the first inclined surface; a second shifting block, pivotally installed to the inner rail surface and configured to be corresponsive to the other side of the actuating portion, and both of the first shifting block and the second shifting block being tilted to an angle and disposed symmetrically and respectively on both sides of the actuating portion, and a second oblique block being protruded from the second shifting block surface, and the second oblique block leaning against the second inclined surface, and an engaging space being formed between the first shifting block and the second shifting block; a first elastic member, installed in the holder and coupled to the pulling rod, such that the pulling rod normally moves in an inward direction with respect to the slide; a second elastic member, suspendably disposed with an interval from a side of the inner rail, and both sides of the second elastic member abutting against the first shifting block and the second shifting block, and the first shifting block and the second shifting block being rotated downwardly to abut against a bottom edge of the inner rail; and a driving member, installed on a side of the middle rail opposite to the inner rail, and the driving member being disposed in the engaging space, and the inner rail and the middle rail being slidably coupled with each other; such that when the pulling rod is operated, the first shifting block and the second shifting block are rotated upward synchronously, so that the engaging space becomes an open space, and the inner rail and the middle rail are separated from each other, and when the pulling rod restores its original position and the inner rail is moved with respect to the middle rail, the driving member upwardly pushes the first shifting block away to return to the engaging space, so that the inner rail and the middle rail are slidably coupled with each other again.

In a preferred embodiment, the pulling rod has a first limiting portion disposed at a fixing position of the first elastic member, so that the pulling rod is limited and moved reciprocally with respect to the fixing position.

Wherein, the pulling rod has a second limiting portion disposed at a pivoting position of the first shifting block, so that the pulling rod is limited and moved reciprocally with respect to the pivoting position. In addition, the inner rail surface has at least one positioning portion disposed under the pulling rod, and the pulling rod is movably clamped in the positioning portion to improve the stably of moving the pulling rod horizontally.

In addition, the first elastic member is a linear spring, and both ends of the first elastic member abut against the pulling rod and the holder respectively to define a latching relation to provide the elastic force for restoring the pulling rod to its original position.

The inner rail release device for a slide of the present invention further comprises an auxiliary block an auxiliary block installed at the other end of the pulling rod opposite to the actuating portion to facilitate an operator to operate the slide, and the actuating portion has a plurality of insert holes configured to be corresponsive to the auxiliary block, and the auxiliary block has two hooks corresponsive to the insert holes for latching and fixing the auxiliary block to the actuating portion to improve the convenience of installation.

In addition, the second elastic member is made of an elastic material, and a first fixed portion and a second fixed portion are formed at an end of the second elastic member, and a first elastic arm and a second elastic arm are extended and formed at the other end of the second elastic member and configured to be corresponsive to the first shifting block and the second shifting block respectively. The first elastic arm has an end abutting against the first shifting block, and the second elastic arm has an end abutting against the second shifting block, so that the first shifting block and the second shifting block are normally maintained facing downward.

In a preferred embodiment, the driving member is a structure having a substantially L-shaped cross-section and made by bending a metal plate, and a side of the driving member is embedded into the surface of the middle rail, and the length of the driving member protruding to the outside is corresponsive to the distance from the middle rail to the inner rail and provided for pushing the first shifting block upward.

DESCRIPTION OF THE PREFERRED EMBODIMENTS

The above and other objects, features and advantages of this disclosure will become apparent from the following detailed description taken with the accompanying drawings.

Figure 1:
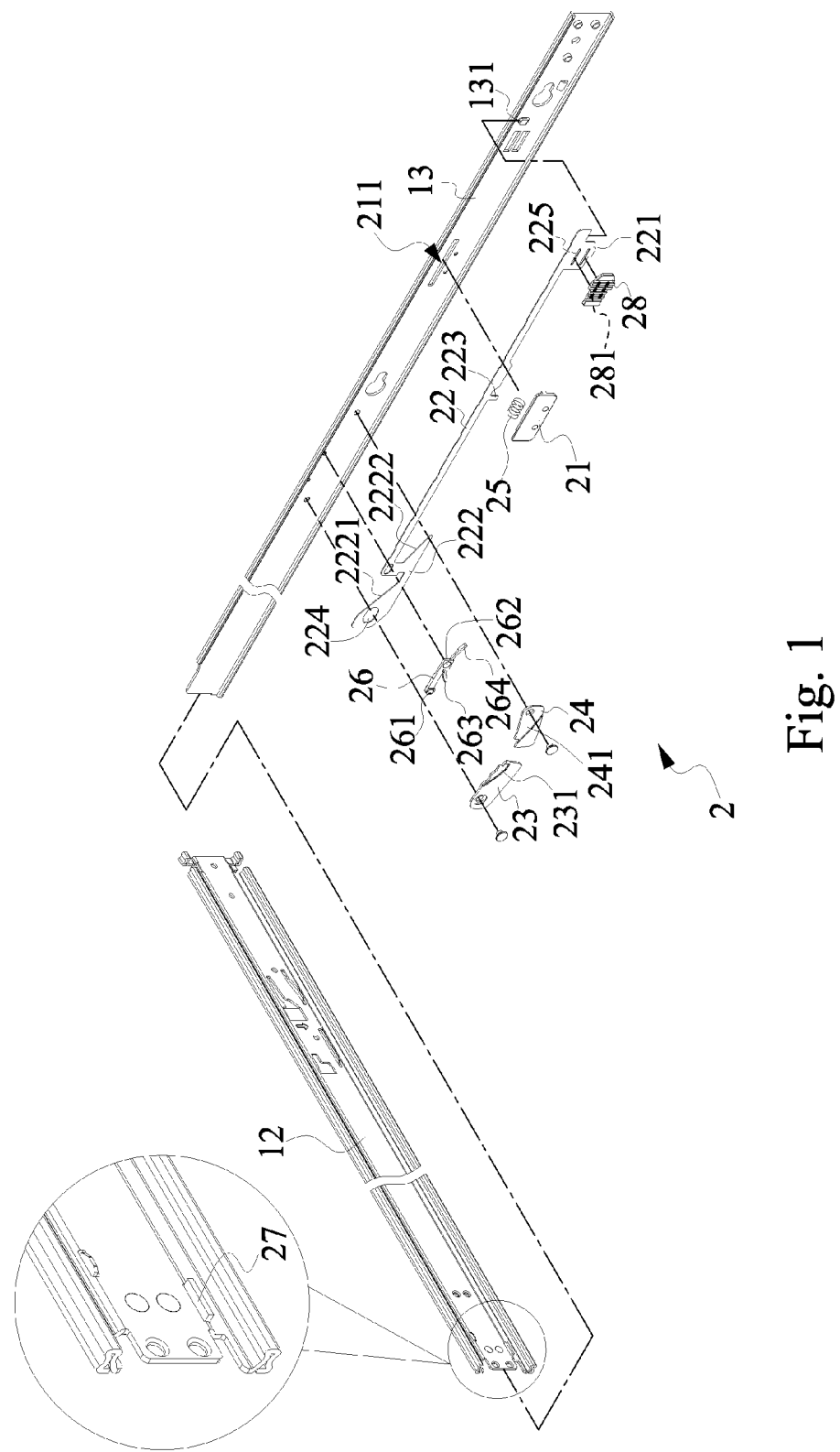
FIG. 1 is an exploded view of a preferred embodiment of the present invention.
Figure 2:
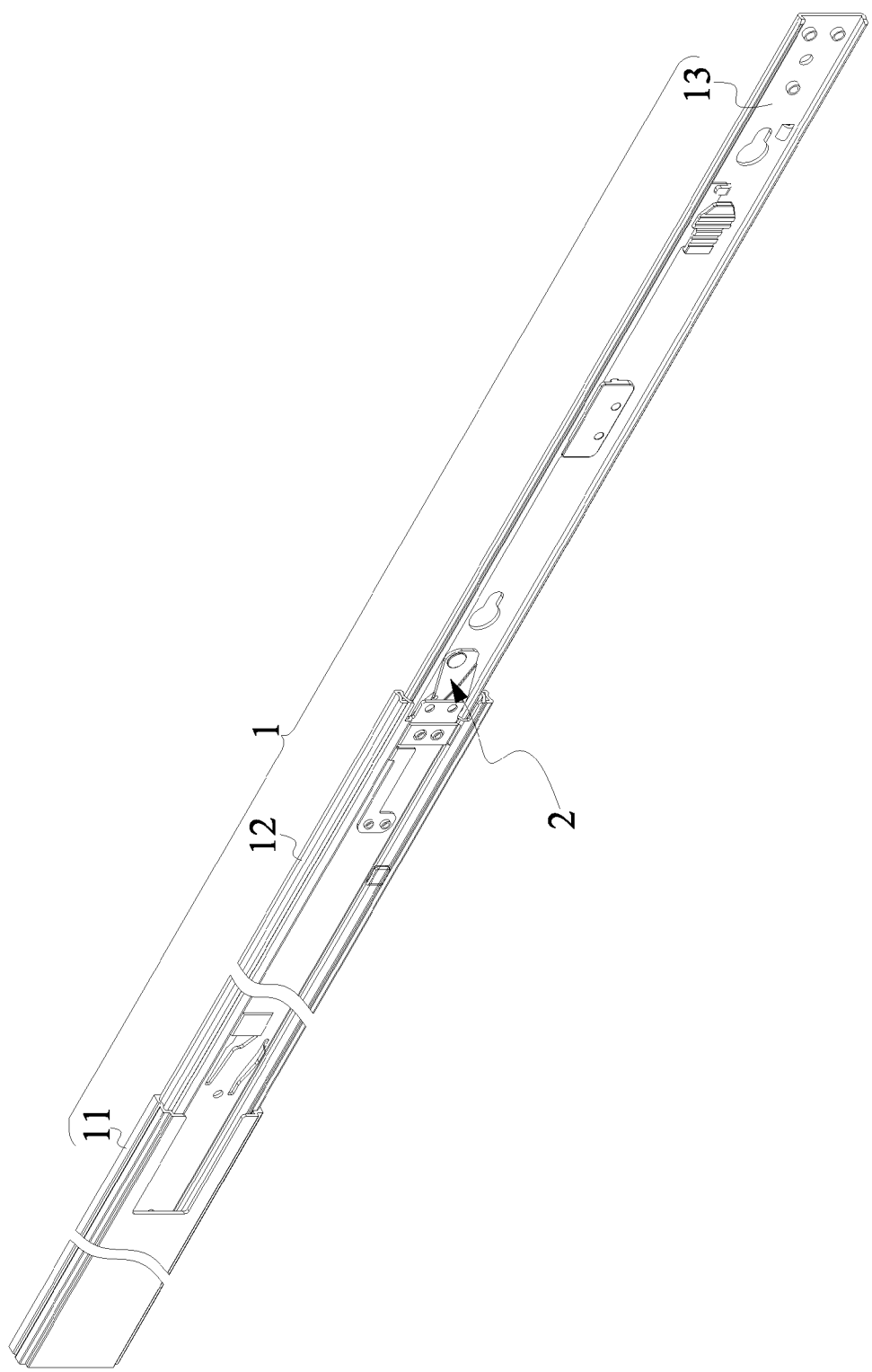
FIG. 2 is a perspective view of a preferred embodiment of the present invention.
Figure 3:
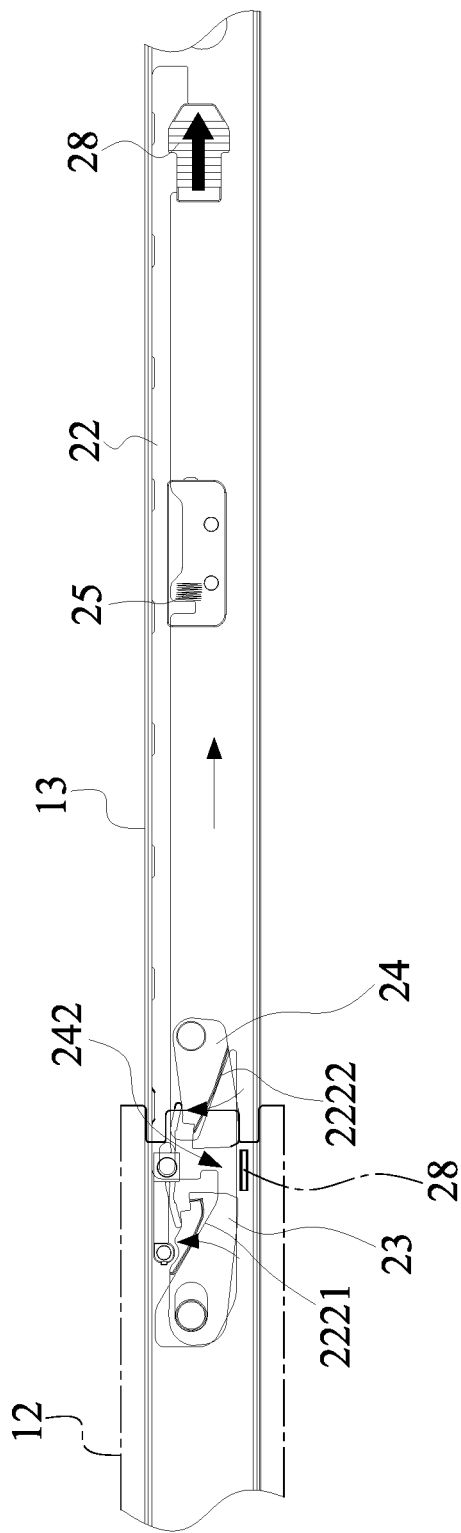
FIG. 3 is a schematic view of the status of a preferred embodiment of the present invention during a release operation.
Figure 4:
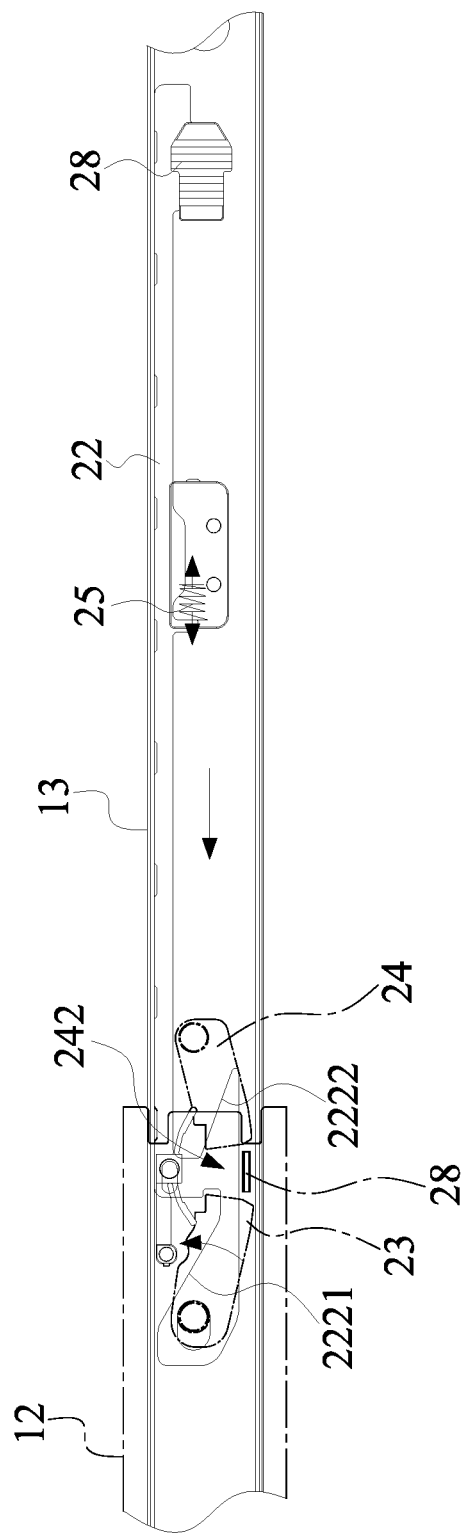
FIG. 4 is a schematic view of the status of a preferred embodiment of the present invention during a latch operation.

With reference to FIGS. 1 to 4 for an exploded view, a perspective view and schematic views of different operation of a preferred embodiment of the present invention respectively, the present invention relates to an inner rail release device 2 for a slide 1, and the inner rail release device 2 comprises a holder 21, a pulling rod 22, a first shifting block 23, a second shifting block 24, a first elastic member 25, a second elastic member 26 and a driving member 27. The slide 1 is formed by an outer rail 11, a middle rail 12 disposed in the outer rail 11 of a sliding assembly, and an inner rail 13 disposed in the middle rail 12 of the sliding assembly, and the inner rail release device 2 is installed on both of the middle rail 12 and the inner rail 13.

Wherein, the holder 21 is disposed on a surface of the inner rail 13, and a sliding space 211 is formed between the holder 21 and the inner rail 13.

The pulling rod 22 is movably installed in the sliding space 211, and the pulling rod 22 is attached closely to a surface of the inner rail 13, and both ends of the pulling rod 22 have an operating portion 221 and an actuating portion 222 respectively. When the actuating portion 222 is moved with respect to the slide 1, a first inclined surface 2221 and a second inclined surface 2222 are extended and formed, and the first inclined surface 2221 and the second inclined surface 2222 are disposed obliquely downward in an outward direction of the slide 1.

The first shifting block 23 is pivotally installed to a surface of the inner rail 13 and configured to be corresponsive to a side of the actuating portion 222, and a first oblique block 231 is protruded from a surface of the first shifting block 23, and the first oblique block 231 leans against the first inclined surface 2221.

The second shifting block 24 is pivotally installed to a surface of the inner rail 13 and configured to be corresponsive to the other side of the actuating portion 222, and both of the first shifting block 23 and the second shifting block 24 are titled to an angle and symmetrically and respectively disposed on both sides of the actuating portion 222, and a second oblique block 241 is protruded from a surface of the second shifting block 24, and the second oblique block 241 leans against the second inclined surface 2222, and an engaging space 242 is formed between the first shifting block 23 and the second shifting block 24.

The first elastic member 25 is installed in the holder 21 and coupled to the pulling rod 22, and the pulling rod 22 is moved normally in an inward direction of the slide 1. It is noteworthy that the first elastic member 25 is a linear spring with both ends abutting the pulling rod 22 and the holder 21 respectively to define a latching relation.

The second elastic member 26 is suspendably disposed with an interval from a side of the inner rail 13, and the second elastic member 26 is made of an elastic material, and a first fixed portion 261 and a second fixed portion 262 are formed at an end of the second elastic member 26, and a first elastic arm 263 and a second elastic arm 264 are extended and disposed at the other end of the second elastic member 26 and configured to be corresponsive to the first shifting block 23 and the second shifting block 24 respectively, and an end of the first elastic arm 263 abuts the first shifting block 23, and an end of the second elastic arm 264 abuts the second shifting block 24, and the first shifting block 23 and the second shifting block 24 are rotated downward to abut against a bottom edge of the inner rail 13.

The driving member 27 is installed on a side of the middle rail 12 opposite to the inner rail 13, and the driving member 27 is disposed in the engaging space 242, and the inner rail 13 and the middle rail 12 are slidably coupled with each other. It is noteworthy that the driving member 27 is a structure made by bending a metal plate and having a substantially L-shaped cross-section. In addition, a side of the driving member 27 is embedded into a surface of the middle rail 12, and the length protruding to the outside is corresponsive to the distance from the middle rail 12 to the inner rail 13.

When the pulling rod 22 is operated and pulled outward, an operator may use the auxiliary block 28 to drive the pulling rod 22 to compress the first elastic member 25, and rotate the first inclined surface 2221 and the second inclined surface 2222 of the actuating portion 222 to link the first shifting block 23 and the second shifting block 24 synchronously upward by using the two pivoting positions as the centers, so that the engaging space 242 becomes an open space, and the inner rail 13 and the middle rail 12 are separated from each other. After the pulling rod 22 restores its original position by the elastic force of the first elastic member 25 and when the inner rail 13 is moved with respect to the middle rail 12, a portion of the driving member 27 is protruded to the outside to upwardly push away the first shifting block 23 and return into the engaging space 242, so that the inner rail 13 and the middle rail 12 are slidably coupled to each other again.

In addition, the pulling rod 22 has a first limiting portion 223 disposed at a fixing position of the first elastic member 25, so that the pulling rod 22 is limited to move reciprocally with respect to the fixing position. Further, the pulling rod 22 has a second limiting portion 224 disposed at a pivoting position of the first shifting block 23, so that the pulling rod 22 is limited to move reciprocally with respect to the pivoting position, and a positioning portion 131 is disposed on a surface of the inner rail 13 and corresponsive to the bottom of the pulling rod 22, and the positioning portion 131 is a U-shaped clamp structure inwardly formed on an inner surface of the inner rail 13 by stamping, so that the pulling rod 22 can be movably clamped into the positioning portion 131.

In addition, the inner rail release device 1 of the present invention further comprises an auxiliary block 28 disposed on the other side of the pulling rod 22 opposite to the actuating portion 222, and the actuating portion 222 has a plurality of insert holes 225 corresponsive to the auxiliary block 28, and the auxiliary block 28 has two hooks 281 configured to be corresponsive to the insert holes 225 and provided for latching and fixing the auxiliary block 28 to the actuating portion 222.

What is claimed is:

1. An inner rail release device for a slide composed of an outer rail, a middle rail disposed inside an outer slide of a sliding assembly, and an inner rail disposed inside the middle rail of the sliding assembly, and the inner rail release device being installed on both of the middle rail and the inner rail, comprising:

a holder, installed on a surface of the inner rail, and a sliding space being defined between the holder and the inner rail;

a pulling rod, movably installed in the sliding space, disposed closely to the surface of the inner rail, and both ends of the pulling rod having an operating portion and an actuating portion respectively, and a first inclined surface and a second inclined surface being extended and formed when the actuating portion is moved with respect to the slide, and the first inclined surface and the second inclined surface being disposed obliquely and downwardly towards the outward direction with respect to the slide;

a first shifting block, pivotally installed to the surface of the inner rail and configured to be corresponsive to a side of the actuating portion, and having a first oblique block protruded from a surface of the first shifting block, and the first oblique block leaning against the first inclined surface;

a second shifting block, pivotally installed to the surface of the inner rail and configured to be corresponsive to an another side of the actuating portion, and both of the first shifting block and the second shifting block being tilted to an angle and disposed symmetrically and respectively on both sides of the actuating portion, and a second oblique block being protruded from a surface of the second shifting block, and the second oblique block leaning against the second inclined surface, and an engaging space being formed between the first shifting block and the second shifting block;

a first elastic member, installed in the holder and coupled to the pulling rod, such that the pulling rod normally moves in an inward direction with respect to the slide;

a second elastic member, suspendably disposed with an interval from a side of the inner rail, and both sides of the second elastic member abutting against the first shifting block and the second shifting block, and the first shifting block and the second shifting block being rotated downwardly to abut against a bottom edge of the inner rail; and a driving member, installed on a side of the middle rail opposite to the inner rail, and the driving member being corresponding to the engaging space, and the inner rail and the middle rail being slidably coupled with each other; such that when the pulling rod is operated, the first shifting block and the second shifting block are rotated upward synchronously, so that the engaging space becomes an open space, and the inner rail and the middle rail are separated from each other, and when the pulling rod restores its original position and the inner rail is moved with respect to the middle rail, the driving member upwardly pushes the first shifting block away to return to the engaging space, so that the inner rail and the middle rail are slidably coupled with each other again.

2. The inner rail release device for a slide according to claim 1, wherein the pulling rod has a first limiting portion corresponding to a fixing position of the first elastic member, so that the pulling rod is limited and moved reciprocally with respect to the fixing position.

3. The inner rail release device for a slide according to claim 2, wherein the pulling rod has a second limiting portion corresponding to a pivoting position of the first shifting block, so that the pulling rod is limited and moved reciprocally with respect to the pivoting position.

4. The inner rail release device for a slide according to claim 3, wherein the inner rail surface has at least one positioning portion corresponding to an underside of the pulling rod, and the pulling rod is movably clamped in the positioning portion.

5. The inner rail release device for a slide according to claim 1, wherein the first elastic member is a linear spring, and both ends of the first elastic member abut against the pulling rod and the holder respectively to define a latching relation.

6. The inner rail release device for a slide according to claim 1, further comprising an auxiliary block installed at an another end of the pulling rod opposite to the actuating portion.

7. The inner rail release device for a slide according to claim 6, wherein the actuating portion has a plurality of insert holes configured to be corresponsive to the auxiliary block, and the auxiliary block has two hooks corresponsive to the insert holes for latching and fixing the auxiliary block to the actuating portion.

8. The inner rail release device for a slide according to claim 1, wherein the second elastic member is made of an elastic material, and a first fixed portion and a second fixed portion are formed at an end of the second elastic member, and a first elastic arm and a second elastic arm are extended and formed at an another end of the second elastic member and configured to be corresponsive to the first shifting block and the second shifting block respectively.

9. The inner rail release device for a slide according to claim 8, wherein the first elastic arm has an end abutting against the first shifting block, and the second elastic arm has an end abutting against the second shifting block.

10. The inner rail release device for a slide according to claim 1, wherein the driving member is a structure having a substantially L-shaped cross-section and made by bending a metal plate, and a side of the driving member is embedded into a surface of the middle rail, and a length of the driving member protruding outside is corresponsive to a distance from the middle rail to the inner rail.

* * * * *